United States Patent
Wu et al.

(10) Patent No.: US 7,839,052 B2
(45) Date of Patent: Nov. 23, 2010

(54) SENSING MEMBRANE WITH STRESS RELEASING STRUCTURE AND MICRO-ELECTRO-MECHANICAL SYSTEM DEVICE USING THE SAME

(75) Inventors: Chia-Yu Wu, Kaohsiung (TW); Jien-Ming Chen, Tainan (TW)

(73) Assignee: Industrial Technology Research Institute, Hsinchu (TW)

( * ) Notice: Subject to any disclaimer, the term of this patent is extended or adjusted under 35 U.S.C. 154(b) by 239 days.

(21) Appl. No.: 12/131,961

(22) Filed: Jun. 3, 2008

(65) Prior Publication Data

US 2009/0151455 A1    Jun. 18, 2009

(30) Foreign Application Priority Data

Dec. 14, 2007    (TW) ............... 96148032 A (51) Int. Cl.
*H01L 21/00* (2006.01)
*H04R 19/00* (2006.01)
(52) U.S. Cl. ............ 310/321; 181/171; 181/172; 381/429; 310/324; 310/338; 310/345
(58) Field of Classification Search ........... 310/321, 310/324, 338, 345; 181/171, 172; 381/429
See application file for complete search history.

(56) References Cited

U.S. PATENT DOCUMENTS

| | | | |
|---|---|---|---|
| 4,776,019 A * | 10/1988 | Miyatake | 381/174 |
| 5,146,435 A | 9/1992 | Bernstein | |
| 6,535,460 B2 * | 3/2003 | Loeppert et al. | 367/181 |
| 6,788,795 B2 | 9/2004 | Scheeper et al. | |
| 7,023,066 B2 | 4/2006 | Lee et al. | |
| 7,040,173 B2 | 5/2006 | Dehe | |
| 7,152,481 B2 | 12/2006 | Wang | |
| 7,268,463 B2 * | 9/2007 | Li et al. | 310/309 |
| 2007/0190680 A1 * | 8/2007 | Fukuda et al. | 438/50 |
| 2007/0286438 A1 * | 12/2007 | Hirade et al. | 381/175 |
| 2009/0001565 A1 * | 1/2009 | Takemoto et al. | 257/729 |
| 2009/0160581 A1 * | 6/2009 | Hagelin et al. | 333/200 |
| 2009/0185700 A1 * | 7/2009 | Suzuki | 381/174 |
| 2009/0278217 A1 * | 11/2009 | Laming et al. | 257/419 |
| 2009/0296181 A1 * | 12/2009 | Omori et al. | 359/224.1 |

FOREIGN PATENT DOCUMENTS

EP    0758080    2/1997

(Continued)

OTHER PUBLICATIONS

English Abstract of EP0758080.

(Continued)

*Primary Examiner*—J. SanMartin
(74) *Attorney, Agent, or Firm*—Thomas, Kayden, Horstemeyer & Risley (57) ABSTRACT

A sensing membrane applied to a micro-electro-mechanical system (MEMS) device includes a body, a stress releasing structure and a connecting portion. The stress releasing structure for releasing a membrane residual stress surrounds the body. The stress releasing structure has several first perforations and several second perforations. The first perforations are located between the body and the second perforations. The connecting portion connects the stress releasing structure and a substrate of the MEMS device.

37 Claims, 6 Drawing Sheets

FOREIGN PATENT DOCUMENTS

| | | |
|---|---|---|
| TW | 262737 | 9/2006 |
| WO | 2006046927 | 5/2006 |

OTHER PUBLICATIONS

"A Novel Capacitive Type Miniature Microphone with a Flexure Hinge Diaphragm" Hye Jin Kim et al.; Optomechatronic Actuators, Manipulation, and Systems Control; Proc. Of SPIE vol. 6374, 63740H (2006).

English Abstract of EP0758080 (Feb. 12, 1997).

* cited by examiner

SENSING MEMBRANE WITH STRESS RELEASING STRUCTURE AND MICRO-ELECTRO-MECHANICAL SYSTEM DEVICE USING THE SAME

This application claims the benefit of Taiwan application Serial No. 96148032, filed Dec. 14, 2007, the subject matter of which is incorporated herein by reference.

BACKGROUND OF THE INVENTION

1. Field of the Invention

The invention relates to a sensing membrane from a semiconductor fabricating process and a micro-electro-mechanical system device using the same.

2. Description of the Related Art

Consumer electronic products are getting more and more popular in the market recently. Various electronic products have increasingly gained their visibility in modern people's daily life. Along with the trend for multifunctional and compact-sized products, manufacturers are devoting in developing products of better integration and lower costs. Over the last few years, manufacturers have integrated Micro-Electro-Mechanical System (MEMS) devices into various products to reduce the size of the products. Common examples of such MEMS devices include MEMS microphones and G-sensors.

Of all the different types of MEMS devices, a kind of sensing device transduces an external signal into an electric signal through the vibration of a membrane. The vibration is generated as the membrane receives the external signal. As a result, many types of signals can be detected by the sensing device accordingly. The sensitivity of the membrane to vibrate with the external signals is vital to the sensing property of the device. However, vast membrane residual stress is accumulated in the membrane structure during subjecting to the manufacturing process, particularly when the membrane is made of complex materials of different coefficients of expansion. The membrane residual stress not only affects the sensitivity of the membrane but also lowers the quality of the sensing device.

On the other hand, the widely applied MEMS devices in the industry are usually made through a wafer-level process, in which several MEMS elements are formed on a single wafer. After the MEMS elements are formed, following process steps including a sawing process are performed to form a single MEMS device. Because the vibration frequency of the membrane is related to the area of the membrane, it is difficult to change the area of the membrane when the desired vibration frequency and the membrane thickness are predetermined. These limitations must be taken into account while determining the volume of the device and the numbers of MEMS element forming on each unit area of the wafer.

SUMMARY OF THE INVENTION

The invention is directed to a sensing membrane and a Micro-Electro-Mechanical System (MEMS) device using the same. The sensing membrane releases the membrane residual stress by way of the stress releasing structure, therefore increasing the sensitivity of the membrane and reducing the required area of the membrane.

According to an aspect of the present invention, a sensing membrane including a body, a stress releasing structure and a connecting portion is provided. The stress releasing structure for releasing a membrane residual stress surrounds the body and has several first perforations and several second perforations. The first perforations are located between the body and the second perforations. The connecting portion connects the stress releasing structure and a substrate of the MEMS device.

According to another aspect of the present invention, a MEMS device including a substrate, a sensing membrane and a back plate is further provided. The sensing membrane includes a body, a stress releasing structure and a connecting portion. The stress releasing structure for releasing a membrane residual stress surrounds the body and has several first perforations and several second perforations. The first perforations are located between the body and the second perforations. The connecting portion connects the stress releasing structure and the substrate. The back plate is disposed at one side of the sensing membrane in parallel and is spaced apart from the sensing membrane by a distance.

The invention will become apparent from the following detailed description of the preferred but non-limiting embodiments. The following description is made with reference to the accompanying drawings.

DETAILED DESCRIPTION OF THE INVENTION

The sensing membrane according to the embodiments of the invention is applied to a Micro-Electro-Mechanical System (MEMS) device. According to the invention, at least two groups of perforations that sequentially surround a body are used for releasing the membrane residual stress, such that the effect of residual stress on the sensitivity of membrane and the area of the sensing membrane can be reduced. The invention is exemplified by several embodiments disclosed below. However, the technology of the invention is not limited thereto. The embodiments are for the purpose of elaboration not for limiting the scope of protection of the invention. Further, unnecessary elements are omitted in the figures of the embodiments to show the technical characteristics of the invention clearly.

Figure 1:
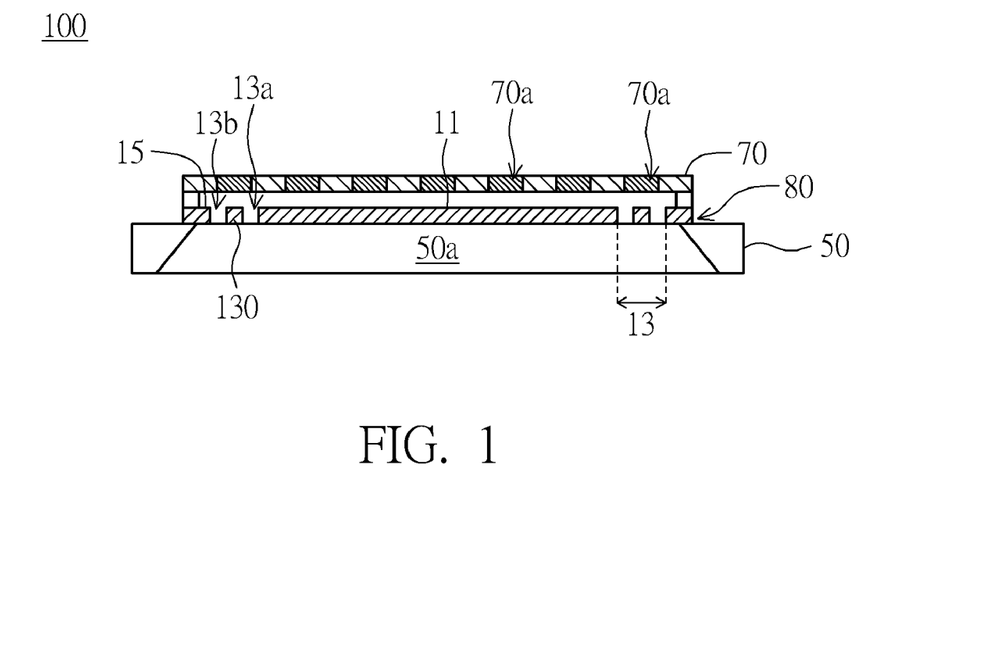
FIG. 1 is a sectional view of the MEMS device according to the preferred embodiment of the invention.

Referring to FIG. 1, a sectional view of the MEMS device according to the preferred embodiment of the invention is shown. The MEMS device 100 is exemplified by a MEMS microphone in the present embodiment. The MEMS device 100 at least includes a substrate 50 and a sensing membrane 80. The substrate 50 has a cavity 50a between the upper and lower surfaces thereof. The sensing membrane 80 is connected to the substrate 50 via the connecting portion 15 so that the sensing membrane 80 can be disposed onto the substrate 50. The sensing membrane 80 covers the upper opening of the cavity 50a such that the membrane 80 is capable of vibrating over the substrate 50.

In the present embodiment, the MEMS device 100 further includes a back plate 70. The back plate 70 is disposed over the sensing membrane 80 in parallel, and is spaced apart from the sensing membrane 80 by a distance. The back plate 70 has several voice inlets 70a, through which the external voice signal can contact the sensing membrane 80. The electric capacity between the sensing membrane 80 and the back plate 70 is changed when the sensing membrane 80 detects the differentiations of sound pressure and vibrates accordingly. The electro-acoustic transducing is performed by the MEMS microphone in this manner. The electro-acoustic transducing theory and operation principles thereof are well known in the related technology fields, and will not repeatedly give the details here. Although the MEMS device 100 is exemplified by a MEMS microphone in the present embodiment, the MEMS device 100 can also be exemplified by a micro multi-focal reflector, a G-sensor, an ultra-sonic sensor, a microwave switch or other MEMS deices utilizing a sensing membrane.

Several embodiments of the sensing membrane 80 are elaborated in the following description with reference to FIG. 2A~FIG. 7B.

First Embodiment

Figure 2A:
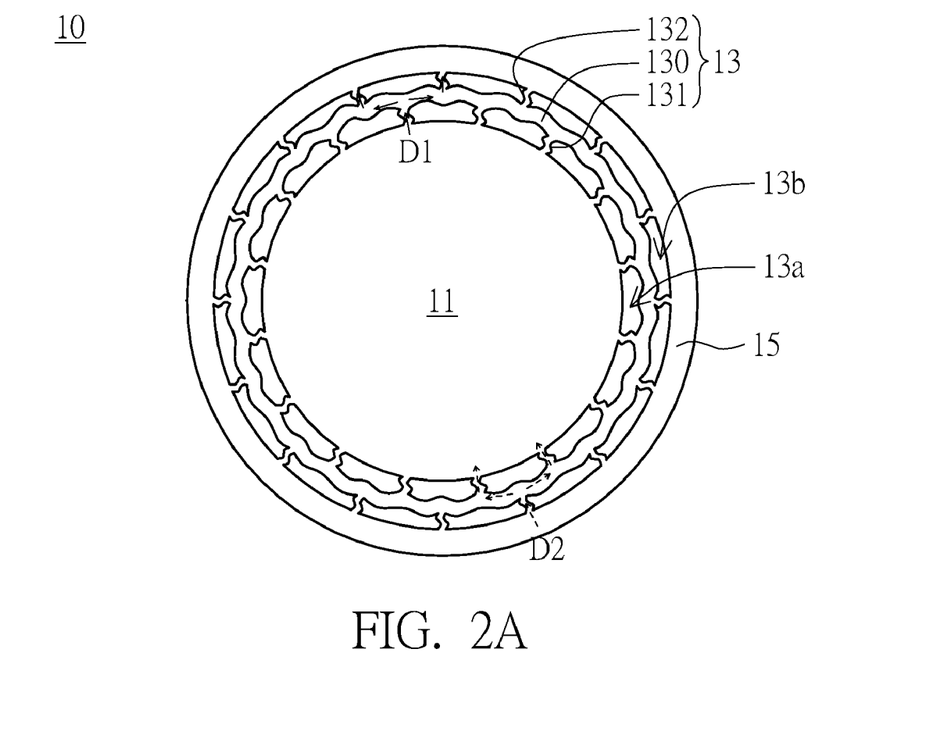
FIG. 2A is a top view of a sensing membrane according to the first embodiment of the invention.

Referring to FIG. 2A, a top view of a sensing membrane according to the first embodiment of the invention is shown. The sensing membrane 10 includes a body 11, a stress releasing structure 13 and a connecting portion 15. The stress releasing structure 13 for releasing a membrane residual stress surrounds the body 11. The stress releasing structure 13 has several first perforations 13a and several second perforations 13b. The first perforations 13a is located between the body 11 and the second perforations 13b. The connecting portion 15 connects the stress releasing structure 13 and a substrate (not show in FIG. 2A) of the MEMS device. The path for releasing the membrane residual stress is formed between two adjacent first perforations 13a, between two adjacent second perforations 13b and between the first and the second perforations 13a, 13b. The membrane residual stress is released through the first perforations 13a and the second perforations 13b sequentially, and the details of releasing the membrane residual stress are described below.

More specifically, the stress releasing structure 13 of the present embodiment includes an elastic ring 130, several first elastic elements 131 and several second elastic elements 132. The elastic ring 130 surrounds the body 11. The first elastic elements 131 connect the inner rim of the elastic ring 130 and the body 11. The second elastic elements 132 connect the outer rim of the elastic ring 130 and the connecting portion 15. Each first perforation 13a is formed among the body 11, two first elastic elements 131 and the elastic ring 130. Each second perforation 13b is formed among the elastic ring 130, two second elastic elements 132 and the connecting portion 15. The body 11 is in a circular form for example, and each first elastic element 131 and second elastic element 132 is arranged in the radial direction of the body 11. Preferably, the first elastic elements 131 and the second elastic elements 132 are alternately connected to the inner and outer rims of the elastic ring 130, such that the first perforations 13a and the second perforations 13b are disposed alternately.

On the other hand, the body 11, the first elastic elements 131, the elastic ring 130, the second elastic elements 132 and the connecting portion 15 are preferably formed integrally in one piece. Therefore, the sensing membrane 10 releases the membrane residual stress within its own structure without the assistance of external elements or materials. Further, each first elastic element 131 and second elastic element 132 is an S-shaped structure and the elastic ring 130 is a wave-like structure for example. The sensing membrane 10 can effectively redistribute and release the membrane residual stress through the physical deformation of the stress releasing structure 13, such as stretching or contracting. For instance, a part of the membrane residual stress applying from the body 11 toward the connecting portion 15, as a first stress releasing direction D1 illustrated in FIG. 2A, is released through the first perforations 13a. The rest of the membrane residual stress is then guided to the second perforations 13b through the first elastic elements 131 and the elastic ring 130. After that, the rest of the membrane residual stress is further released through the second perforations 13b. Then the stress is additionally redistributed to the connecting portion 15 through two adjacent second elastic elements 132 that are alternately disposed with the first elastic elements 131. In this manner, the sensing membrane 10 is able to release different local compression stresses via the stress releasing structure 13. On the other hand, a part of the membrane residual stress applying from the connecting portion 15 toward the body 11, as a second stress releasing direction D2 illustrated in FIG. 2A, is released through the second perforations 13a. The rest of the membrane residual stress is then guided to the first perforations 13a through the second elastic elements 132 and the elastic ring 130. Afterwards, the rest of the membrane residual stress is further released through the first perforations 13a. Then the stress is redistributed to the body 11 through two adjacent first elastic elements 131 that are alternately disposed with the second elastic elements 132. In this manner, the sensing membrane 10 releases different local tension stresses via the stress releasing structure 13. Once the local compression stresses and the local tension stresses are released, the sensitivity of the sensing membrane 10 is free from being affected by the membrane residual stress.

Figure 2B:
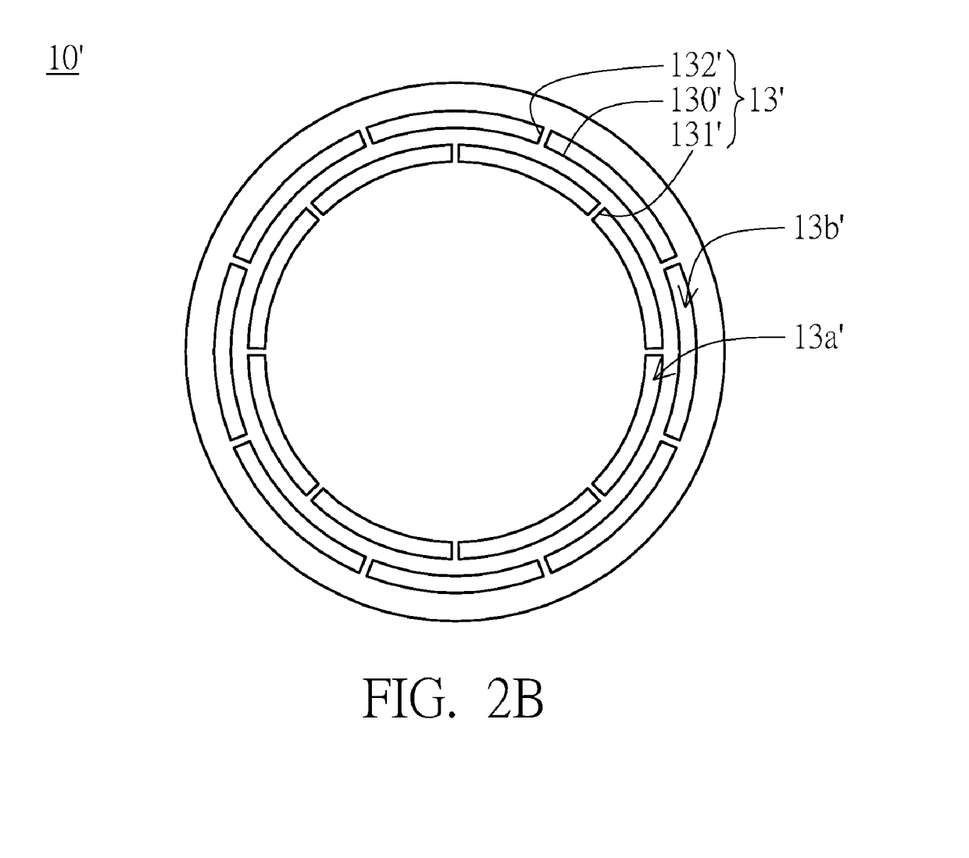
FIG. 2B is a top view of another sensing membrane according to the first embodiment of the invention.

As shown in FIG. 2A, each first elastic element 131 and second elastic element 132 according to the present embodiment is exemplified by an S-shaped structure, and the elastic ring 130 of the present embodiment is exemplified by a wave-like structure. However, any one who is skilled in the technology field of the invention can understand that the structures of the elements are not limited thereto. Each first elastic element 131 and second elastic element 132 can also be an M-shaped structure, a Z-shaped structure or other different shapes. The elastic ring 130 can also be in the form of sawtooth-shaped or other applicable shapes. Referring to FIG. 2B, a top view of another sensing membrane according to the first embodiment of the invention is shown. In the stress reliving structure 13' of the sensing membrane 10', each first and second elastic element 131', 132' is substantially a rectangle. The elastic ring 130' is in a circular form with smooth rims, and each first and second perforation 13a', 13b' also has smooth edges.

Apart from that, the number of the first elastic elements 131 and the number of the second elastic elements 132 are respectively presented by 16 for example, which respectively forms 16 second perforations 13a and 16 second perforations 13b, as shown in FIG. 2A. However, the numbers of these elements are not limited thereto, and the sensing membrane 10 can have different numbers of first elastic elements 131 and second elastic elements 132. Preferably, the first and the second elastic elements 131, 132 are respectively equidistantly connected with the elastic ring 130. Therefore, the body 11 is supported by the stress releasing structure 13 evenly when the sensing membrane 10 is connected to the substrate through the connecting portion 15. Furthermore, each first elastic element 131 and each second elastic element 132 can connect to the elastic ring 130 at the same position.

In the above-described first embodiment of the invention, the stress releasing structure 13 is exemplified by having several first perforations 131 and several second perforations 132 surrounding the body 11 sequentially. However, the stress releasing structure 13 can further have a second elastic ring and several third elastic elements. Thus, the sensing membrane 10 further has several third perforations surrounding the second perforations 132 in addition to the first and second perforations 131, 132. In other words, any sensing membrane that has two or more than two groups of perforations surrounding the body for releasing the membrane residual stress lies in the scope of the invention.

On the other hand, the sensing membrane 10 of the present embodiment can be made of carbon-based polymers, silicon, silicon nitride, polycrystalline silicon, amorphous silicon, silicon dioxide, silicon carbide, germanium, gallium, arsenide, carbon, titanium, gold, iron, copper, chromium, tungsten, aluminum, platinum, nickel, tantalum, other applicable metals or alloys thereof. Moreover, the pattern of the stress releasing structure 13 could be formed by etching; for example, subjecting the sensing membrane 10 to a photolithography process.

Figure 3:
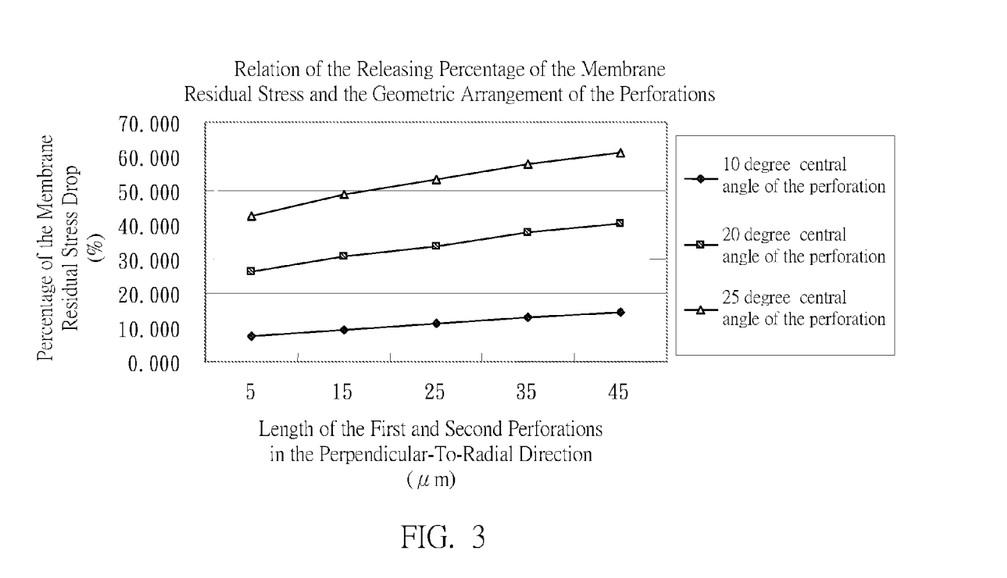
FIG. 3 is a diagram showing the relation of the releasing percentage of residual stress and the geometric arrangement of the perforations.

According to a test result, the membrane residual stress releasing percentage increases when the length of the first and second perforations 13a, 13b in the perpendicular-to-radial direction is increased. The test is conducted through a circular sensing membrane having a circle of perforations surrounding the body. The radius of the membrane is 250 μm and the thickness of the membrane is 0.275 μm. Referring to FIG. 3, a diagram showing the relation of the releasing percentage of the membrane residual stress and the geometric arrangement of the perforations is illustrated. The releasing percentage of the membrane residual stress is relatively increased when the corresponding central angle of the arc of each perforation is increased, or when the length of the perforation in the perpendicular-to-radial direction is increased, that is, when the area of each perforation is increased. Additionally, according to the test result, the vibration frequency of the sensing membrane is lowered along with the reduction of the area of each perforation, and the vibration frequency is raised along with the increment of the radius of the sensing membrane. Therefore, under the conditions of same membrane thickness and predetermined vibration frequency, the radius of the sensing membrane can be decreased by increasing the area of the perforations. That is, when the vibration frequencies and the thicknesses of the membranes are the same, the area of the sensing membrane of the present embodiment is less than that of the prior art.

The sensing membrane 10 has the stress releasing structure 13 surrounding thereof, so membrane residual stress can be effectively released lest the sensitivity of the sensing membrane is affected by the membrane residual stress. As a result, the sensitivity of the MEMS device 100 (illustrated in FIG. 1) is improved. Meanwhile, the sensing membrane 10 can have less area and maintain the vibration frequency at the same time, thus reducing the overall volume of the MEMS device 100. Therefore, more elements can be fabricated on the wafer, and the cost can be lowered accordingly.

Second Embodiment

The sensing membrane of the present embodiment is different from the above-described sensing membrane of the first embodiment in the design of the stress releasing structure. Other similarities are omitted and will not be repeated.

Figure 4:
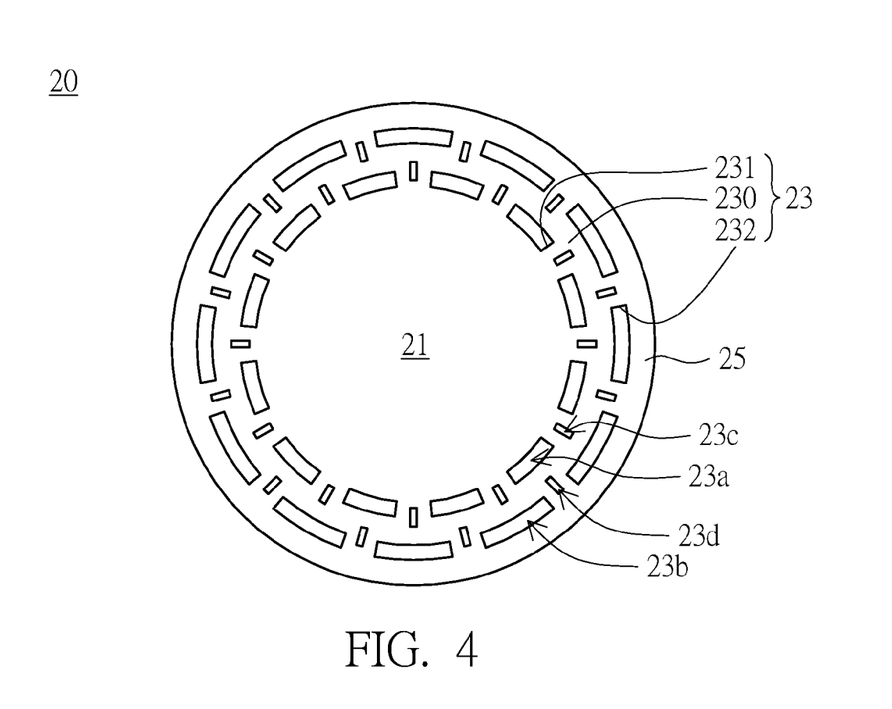
FIG. 4 is a top view of a sensing membrane according to the second embodiment of the invention.

Referring to FIG. 4, a top view of a sensing membrane of the second embodiment of the invention is shown. The sensing membrane 20 includes a body 20, a stress releasing structure 23 and a connecting portion 25. The stress releasing structure 23 surrounds the body 21 and includes an elastic ring 230, several first elastic elements 231 and several second elastic elements 232. In the present embodiment, the body 21 is in a circular form for example. The stress releasing structure 23 has several first perforations 23a, several second perforations 23b, several third perforations 23c and several fourth perforations 23d. Each first perforation 23a is formed among the body 21, two first elastic elements 231 and the elastic ring 230. Each second perforation 23b is formed among the elastic ring 230, two second elastic elements 232 and the connecting portion 25. Each third perforation 23c is located at a position where each first elastic element 231 is connected with the elastic ring 230. Each fourth perforation 23d is located at a position where the second elastic element 232 is connected with the elastic ring 230.

In the present embodiment, each third and fourth perforation 23c, 23d is a rectangle. A longitudinal direction of each rectangle passes through a substantial center of the body 21. That is, each third and fourth perforation 23c, 23d is disposed in the radial direction of the body 21. The third perforations 23c are preferably spaced away from the body 21, and the fourth perforations 23d are preferably spaced away from the connecting portion 25. The sensing membrane 20 releases the membrane residual stress applying from the body 21 toward the connecting portion 25 or vice versa through the first perforations 23a and the second perforations 23b. The membrane residual stress applying in the tangent direction of the body 21 is released via the third perforations 23c and the fourth perforations 23d.

Third Embodiment

The sensing membrane of the present embodiment is different from the sensing membrane of the first embodiment in the shape of the membrane and the arrangement of the first and second perforations. Other similarities are omitted and will not be repeated here.

Figure 5A:
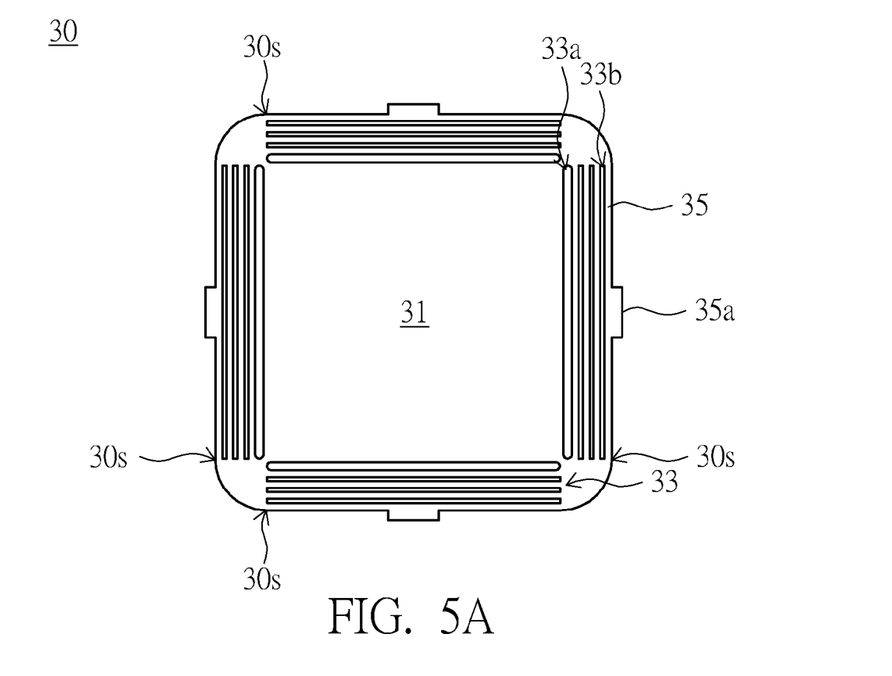
FIG. 5A is a top view of a sensing membrane according to the third embodiment of the invention.
Figure 5B:
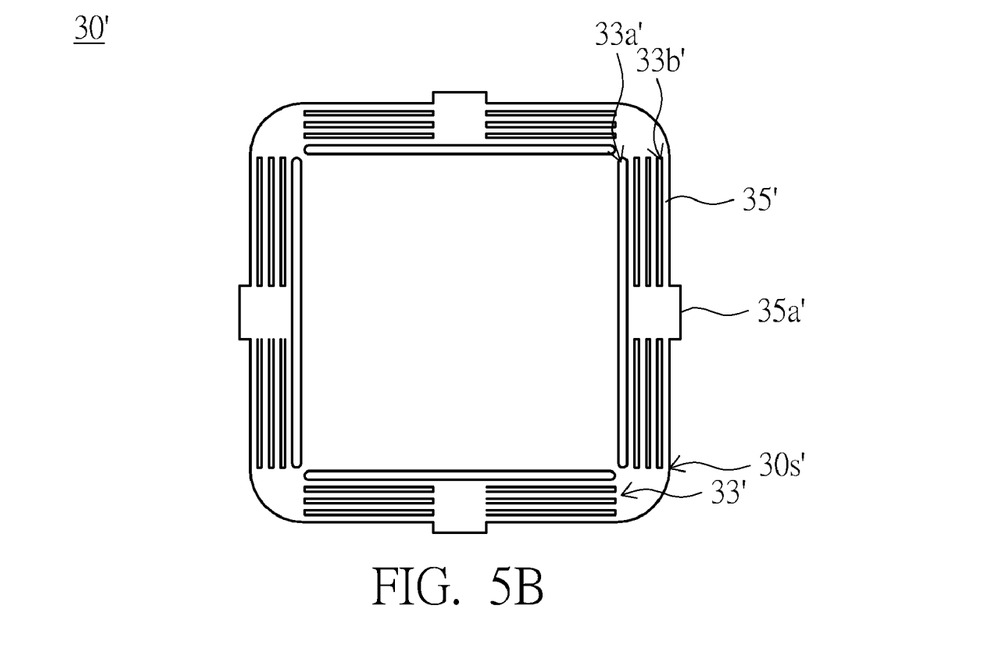
FIG. 5B is a top view of another sensing membrane according to the third embodiment of the invention.

Referring to FIG. 5A, a top view of a sensing membrane according to the third embodiment of the invention is illustrated. The sensing membrane 30 includes a body 31, a stress releasing structure 33 and a connecting portion 35. The stress releasing structure 33 surrounds the body 31 and has several first perforations 33a and several second perforations 33b. The first perforations 33a is located between the body 31 and the second perforations 33b. The connecting portion 35 connects the stress releasing structure 33 and a substrate of the MEMS device.

More specifically, the body 31 in the present embodiment is in a polygonal form and has several side edges 30s. Each first and second perforation 33a is in a strip form. Each first perforation 33a is parallel to the corresponding side edge 30s. Each one of the first perforations 33a is correspondingly located by more than one second perforation 33b, and each second perforation 33b is parallel to corresponding first perforation 33a. In the present embodiment, the body 31 is exemplified by a quadrangle, and the stress releasing structure 33 is exemplified by having four first perforations 33a corresponding to the side edges 30s, as shown in FIG. 5A. However, the shape of the body 31 is not limited thereto. The body 31 can also be a pentagon, a hexagon or a polygon with more than six sides. Moreover, the perforations 33a, 33b not only can be formed in strips, but also can be formed in irregular shapes. Each of the first perforation 33a is correspondingly located by three second perforations 33b. Each second perforation 33b not only is substantially parallel to the corresponding first perforations 33a, but also has substantially the same length as the corresponding first perforations 33a.

Further, the connecting portion 35 in the present embodiment can further include several protruding edges 35a protruding in the directions perpendicular to corresponding side edges 30s. The sensing membrane 30 is connected to the substrate through the protruding edges 35a.

On the other hand, the second perforations 33b can also have different length from the first perforations 33a. Please refer to FIG. 5B, a top view of another sensing membrane according to the third embodiment of the invention is illustrated. In the sensing membrane 30' shown in FIG. 5B, each second perforation 33b' is shorter than each corresponding first perforation 33a'. The connecting portion 35' also has several protruding edges 35a'. The second perforations 33b' are disposed at two sides of each protruding edge 35a' along the corresponding side edge 30s'. Therefore, the supporting strength of the sensing membrane 30' connecting to the substrate via the protruding edges 35a' is enhanced.

Fourth Embodiment

The sensing membrane is different from the sensing membrane of the third embodiment in the arrangement of the first perforations and the second perforations. Other similarities are omitted and will not be repeated here.

Figure 6:
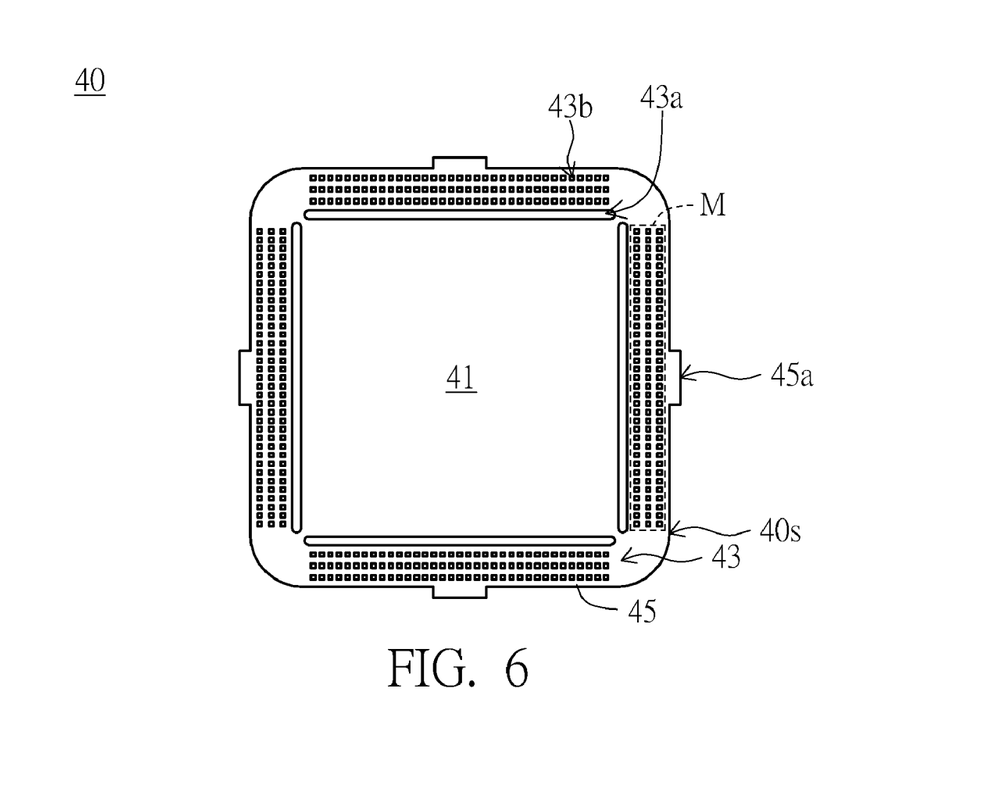
FIG. 6 is a top view of a sensing membrane according to the fourth embodiment of the invention.

Referring to FIG. 6, a top view of a sensing membrane according to the fourth embodiment of the invention is illustrated. The sensing membrane 40 includes a body 41, stress releasing structure 43 and a connecting portion 45. The body 41 is a quadrangle and has several side edges 40s. In the stress releasing structure 43, several first perforations 43a are strips and each first perforation 43a is parallel to a corresponding side edge 40s. In the present embodiment, each second perforation 43b is a rectangular opening whose area is far smaller than the area of a first perforation 43a. These second perforations 43b are arranged as several rectangular arrays M. Each of the arrays M is located by a first perforation 43a. The long side of each array M is parallel to corresponding first perforation 43a and has the same length as the first perforation 43a.

Further, the connecting portion 45 can include several protruding edges 45a for example. Each protruding edge 45a is protruded in the direction perpendicular to the corresponding side edge 40s. The sensing membrane 40 is connected to the substrate via these protruding edges 45a for example. In another embodiment, the long side of each array M is shorter than the corresponding first perforation 43a. The arrays M are disposed at two sides of each protruding edge 45a along the corresponding side edge 40s. That is, each first perforation 43a is located by two rectangular arrays M. The length of the long side of the arrays M can be adjusted to fit in with different product designs. In addition to that, each first perforation 43a can also be located by more than two arrays M.

Fifth Embodiment

Figure 7A:
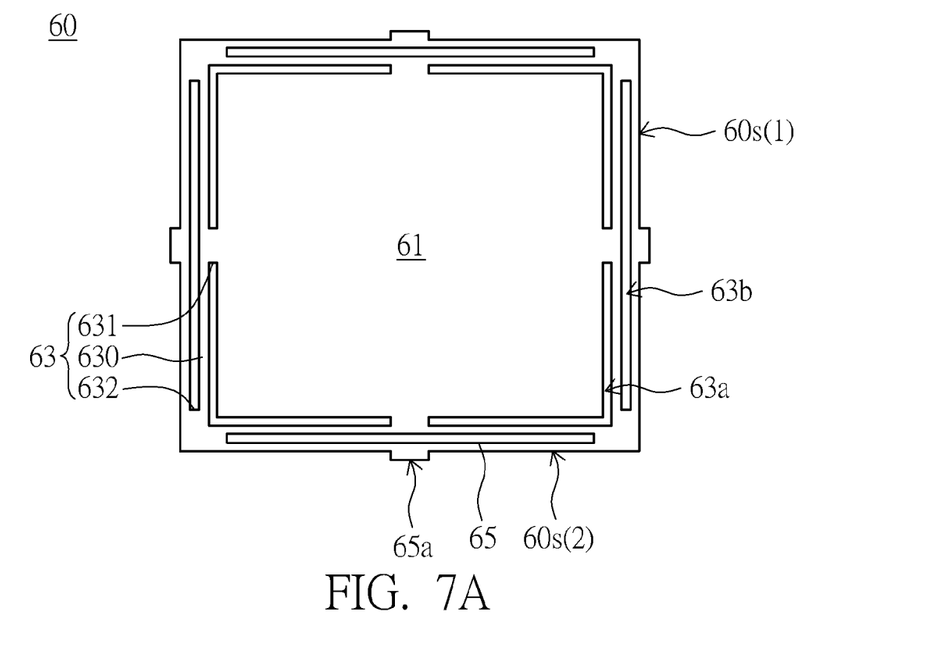
FIG. 7A is a top view of a sensing membrane according to the fifth embodiment of the invention.

The sensing membrane of the present embodiment is different from the sensing membrane of the above-described third embodiment in the arrangement of the first perforations and the second perforations. Other similarities are omitted and will not be repeated again. Please refer to FIG. 7A, a top view of a sensing membrane according to the fifth embodiment of the invention is illustrated. The sensing membrane 60 includes a body 61, a stress releasing structure 63 and a connecting portion 65. The body 61 is a quadrangle in the present embodiment and has several side edges 60s. The stress releasing structure 63 includes several first elastic elements 631, an elastic ring 630 and several second elastic elements 632. Each first perforation 63a of the stress releasing structure 63 is formed among the body 61, two first elastic elements 631 and the elastic ring 630. Each second perforation 632 is formed among the elastic ring 630, two second elastic elements 632 and the connecting portion 65. Each first perforation 63a is disposed along more than one side edge 60s. Each second perforation 63b is parallel to the corresponding side edge 60s for example. As shown in FIG. 7A, one first perforation 63a is disposed along two side edges 60s(1), 60s(2). Therefore, the corners of the body 61 are surrounded by the first perforations 63a to release the membrane residual stress. Besides that, the connecting portion 65 has several protruding edges 65a, by which the sensing membrane 60 is connected to a substrate of the MEMS device.

Figure 7B:
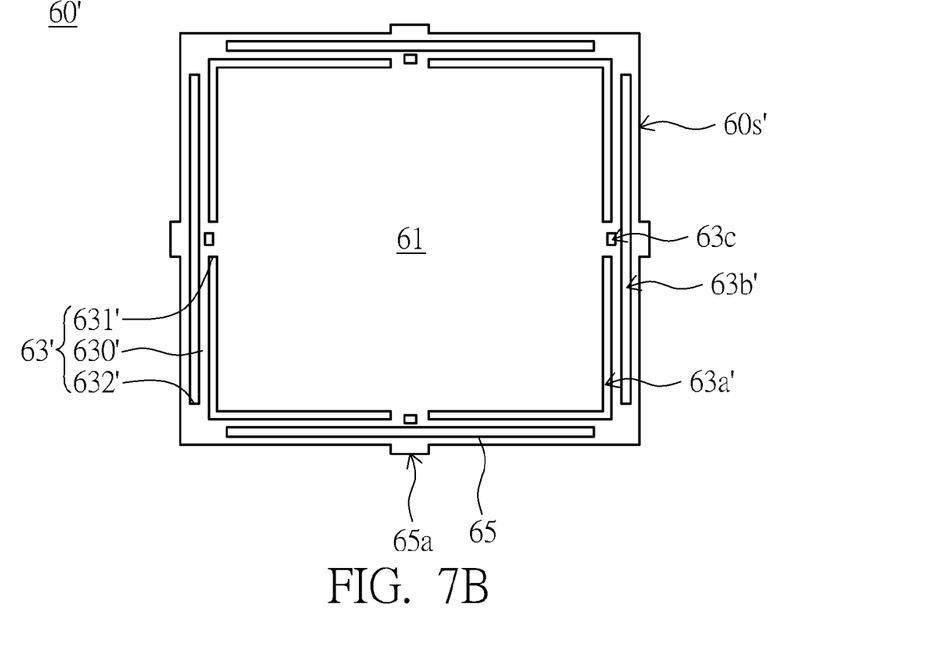
FIG. 7B is a top view of another sensing membrane according to the fifth embodiment of the invention.

Moreover, please refer to FIG. 7B, another sensing membrane according to the fifth embodiment of the invention is illustrated. The stress releasing structure 63' of the sensing membrane 60' further has several third perforations 63c other than the first perforations 63a' and the second perforations 63b'. Each third perforation 63c is located at a position where the first elastic element 631' is connected with the elastic ring 630' for releasing the residual stress in the direction parallel to the corresponding side edge 60s'. The first perforations 63c are preferably spaced away from the body 61. In another embodiment, each third perforations 63c is located at a position where the second elastic element 632' is connected with the elastic ring 630'. Besides, the shape of the third perforations 63c is not limited in the present embodiment. The third perforations 63c can be squares, rectangles parallel to the corresponding side edges 60s', rectangles perpendicular to the corresponding side edges 60s' or irregular shapes.

The above-described sensing membrane and the MEMS device using the same according to the embodiments of the invention releases different local compression stresses and different tension stresses via the stress releasing structure having several first elastic elements, an elastic ring and several second elastic elements. Further, the membrane residual stress is released through the first perforations and the second perforations surrounding the body. The sensing membrane according to the embodiments of the invention is applicable to well-known MEMS devices that utilize membrane technology, and the sensitivity of the MEMS device using the sensing membrane according to the embodiments of the invention is increased. In addition to that, the volume of the MEMS device can be further reduced by decreasing the area of the sensing membrane, and the cost is lowered accordingly.

While the invention has been described by way of example and in terms of the first and the second embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A sensing membrane, applied to a micro-electro-mechanical system (MEMS) device, comprising:
   a body;
   a stress releasing structure surrounding the body for releasing a membrane residual stress, the stress releasing structure having an elastic ring, a plurality of first perforations, a plurality of second perforations and a plurality of third perforations, wherein the first perforations are located between the body and the elastic ring, the elastic ring is located between the first perforations and the second perforations, and each of the third perforations is located between two neighboring first perforations and one of the second perforations, and the third perforations are arranged in a radiated pattern at an inner rim of the elastic ring; and a connecting portion for connecting the stress releasing structure and a substrate of the MEMS device.

2. The sensing membrane according to claim 1, wherein the elastic ring surrounds the body in a circular form or a polygon, and the stress releasing structure further comprises:

a plurality of first elastic elements connecting the inner rim of the elastic ring and the body; and a plurality of second elastic elements connecting the outer rim of the elastic ring and the connecting portion.

3. The sensing membrane according to claim 2, wherein the body is in a circular form, and each first elastic element and each second elastic element are arranged in the radial direction of the body.

4. The sensing membrane according to claim 2, wherein the first elastic elements and the second elastic elements are alternately connected to the inner and outer rims of the elastic ring.

5. The sensing membrane according to claim 2, wherein each first perforation is formed among the body, two first elastic elements and the elastic ring, and each second perforation is formed among the elastic ring, two second elastic elements and the connecting portion.

6. The sensing membrane according to claim 2, wherein the elastic ring is a wave-like structure.

7. The sensing membrane according to claim 2, wherein each first elastic elements is an S-shaped structure.

8. The sensing membrane according to claim 2, wherein each second elastic element is an S-shaped structure.

9. The sensing membrane according to claim 2, wherein the body, the first elastic elements, the elastic ring, the second elastic elements and the connecting portion are formed integrally in one piece.

10. The sensing membrane according to claim 2, wherein each third perforation being substantially disposed at a position where each first elastic element is connected with the elastic ring for releasing a membrane residual stress of the elastic ring.

11. The sensing membrane according to claim 10, wherein each third perforation is a rectangle, and a longitudinal direction of each third perforation passes through a substantial center of the body.

12. The sensing membrane according to claim 2, wherein the stress releasing structure further has a plurality of fourth perforations, each fourth perforation being substantially disposed at a position where each second elastic element is connected with the elastic ring for releasing a membrane residual stress of the elastic ring.

13. The sensing membrane according to claim 12, wherein each of the third perforations and the fourth perforations is a rectangle, and a longitudinal direction of each third and fourth perforation passes through a substantial center of the body.

14. The sensing membrane according to claim 1, wherein the body is in a polygonal form and has a plurality of side edges, each first perforation being substantially parallel to each corresponding side edge.

15. The sensing membrane according to claim 14, wherein each one of the first perforations is correspondingly located by more than one second perforation, and each second perforation is substantially parallel to each corresponding first perforation.

16. The sensing membrane according to claim 15, wherein at least part of the second perforations have the same length as the corresponding first perforations.

17. The sensing membrane according to claim 15, wherein the second perforations are shorter than the corresponding first perforations.

18. The sensing membrane according to claim 15, wherein each first perforation is in a strip form.

19. The sensing membrane according to claim 15, wherein each first perforation is in an irregular shape.

20. The sensing membrane according to claim 15, wherein each second perforation is in a strip form.

21. The sensing membrane according to claim 15, wherein each second perforation is in an irregular shape.

22. The sensing membrane according to claim 14, wherein the connecting portion comprises:

a plurality of protruding edges protruding in the directions perpendicular to the side edges for connecting with the substrate.

23. The sensing membrane according to claim 14, wherein the second perforations are arranged as a plurality of rectangular arrays, each one of the first perforations being correspondingly disposed by more than one rectangular array, the long side of each rectangular array being parallel to each corresponding first perforation.

24. The sensing membrane according to claim 23, wherein at least part of the long sides of the rectangular arrays have the same length as the corresponding first perforations.

25. The sensing membrane according to claim 1, wherein the body is in a polygonal form and has a plurality of side edges, each of the first perforations being disposed substantially along more than one side edge.

26. A micro-electro-mechanical system device, comprising:

a substrate;

a sensing membrane comprising:

a body;

a stress releasing structure surrounding the body for releasing a membrane residual stress, the stress releasing structure having an elastic ring, a plurality of first perforations, a plurality of second perforations and a plurality of third perforations, wherein the first perforations are located between the body and the elastic ring, the elastic ring is located between the first perforations and the second perforations, and each of the third perforations is located between two neighboring first perforations and one of the second perforations, and the third perforations are arranged in a radiated pattern at an inner rim of the elastic ring; and a connecting portion for connecting the stress releasing structure and the substrate; and a back plate disposed at one side of the sensing membrane in parallel and spaced apart from the sensing membrane by a distance.

27. The MSMS device according to claim 26, wherein the elastic ring surrounds the body in a circular form or a polygon, and the stress releasing structure further comprising:

a plurality of first elastic elements connecting the inner rim of the elastic ring and the body; and a plurality of second elastic elements connecting the outer rim of the elastic ring and the connecting portion.

28. The MEMS device according to claim 27, wherein the body is in a circular form, and each first elastic element and each second elastic element are arranged in the radial direction of the body.

29. The MEMS device according to claim 27, wherein the first elastic elements and the second elastic elements are alternately connected to the inner and outer rims of the elastic ring.

30. The MEMS device according to claim 27, wherein each first perforation is formed among the body, two first elastic elements and the elastic ring, and each second perforation is formed among the elastic ring, two second elastic elements and the connecting portion.

31. The MEMS device according to claim 27, wherein the body, the first elastic elements, the elastic ring, the second elastic elements and the connecting portion are formed integrally in one piece.

32. The MEMS device according to claim 27, wherein each third perforation being substantially disposed at a position where each first elastic element is connected with the elastic ring for releasing a membrane residual stress of the elastic ring.

33. The MEMS device according to claim 27, wherein the stress releasing structure further has a plurality of fourth perforations, each fourth perforation being substantially disposed at a position where each second elastic element is connected with the elastic ring for releasing a membrane residual stress of the elastic ring.

34. The MEMS device according to claim 26, wherein the body is in a polygonal form and has a plurality of side edges, each first perforation being substantially parallel to each corresponding side edge.

35. The MEMS device according to claim 34, wherein each one of the first perforations is correspondingly located by more than one second perforation, and each second perforation is substantially parallel to each corresponding first perforation.

36. The MEMS device according to claim 34, wherein the second perforations are arranged as a plurality of rectangular arrays, each one of the first perforations being correspondingly disposed by more than one rectangular array, the long side of each rectangular array is parallel to each corresponding first perforation.

37. The MEMS device according to claim 26, wherein the body is in a polygonal form and has a plurality of side edges, each first perforation being disposed substantially along more than one side edge.

* * * * *